US012668871B2

(12) United States Patent
Mathiak et al.

(10) Patent No.: US 12,668,871 B2
(45) Date of Patent: Jun. 30, 2026

(54) ELECTRODE AND METHOD FOR PRODUCTION

(71) Applicant: CONDIAS GmbH, Itzehoe (DE)

(72) Inventors: Dirk Mathiak, Hennstedt (DE);
Thorsten Matthée, Hohenaspe (DE)

(73) Assignee: CONDIAS GmbH, Itzehoe (DE)

( * ) Notice: Subject to any disclaimer, the term of this patent is extended or adjusted under 35 U.S.C. 154(b) by 628 days.

(21) Appl. No.: 17/728,066

(22) Filed: Apr. 25, 2022

(65) Prior Publication Data

US 2022/0341035 A1    Oct. 27, 2022

(30) Foreign Application Priority Data

Apr. 26, 2021    (DE) ..................... 10 2021 110 587.0

(51) Int. Cl.
*B32B 9/00*        (2006.01)
*C23C 16/02*       (2006.01)
*C23C 16/26*       (2006.01)

(52) U.S. Cl.
CPC .......... *C23C 16/26* (2013.01); *C23C 16/0236* (2013.01)

(58) Field of Classification Search
CPC .... C23C 16/26; C23C 16/0236; Y10T 428/30
USPC ........................................................ 428/408
See application file for complete search history.

(56) References Cited

U.S. PATENT DOCUMENTS

| | | | |
|---|---|---|---|
| 8,142,623 B2 | 3/2012 | Tojo et al. |
| 8,597,731 B2 | 12/2013 | Fryda |
| 2009/0301865 A1 | 12/2009 | Yoshida |
| 2010/0038235 A1 | 2/2010 | Yoshida |
| 2011/0247929 A1 | 10/2011 | Nagai |
| 2012/0138454 A1 | 6/2012 | Tojo |

FOREIGN PATENT DOCUMENTS

| | | | |
|---|---|---|---|
| CN | 104123973 A | * | 10/2014 |
| DE | 10219688 A1 | | 11/2003 |
| DE | 602005002661 T2 | * | 1/2008 |
| EP | 1433867 A2 | | 6/2004 |
| EP | 2826576 A1 | | 1/2015 |
| JP | 2011102410 A | * | 5/2011 |
| JP | 201602600 A | | 1/2016 |
| JP | 2018095903 A1 | | 6/2018 |
| WO | 2007083740 A1 | | 7/2007 |
| WO | 2014072458 A1 | | 5/2014 |

* cited by examiner

*Primary Examiner* — Daniel H Miller
(74) *Attorney, Agent, or Firm* — WCF IP

(57) ABSTRACT

An electrode for an electrochemical reaction bath has a base body, an active side which is configured to come into contact with the reaction bath, and a passive side which is configured to come into contact with at least one electrical conductor. The passive side includes a doped carbon coating that is preferably less than 5 μm in thickness. Preferably the doped carbon coating is a doped polycrystalline diamond coating in $sp^3$ configuration and is doped with boron.

10 Claims, 1 Drawing Sheet

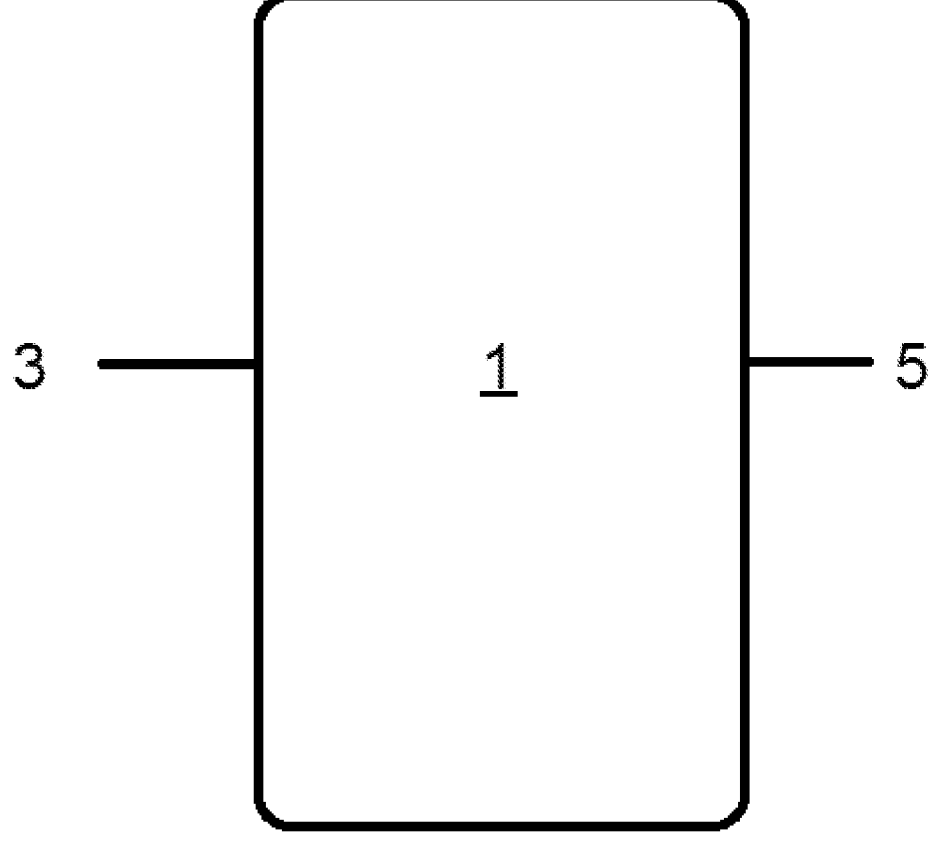

ELECTRODE AND METHOD FOR PRODUCTION

FIELD OF THE INVENTION

The invention relates to an electrode for an electrochemical reaction bath, the electrode having a base body, an active side which is configured to come into contact with the reaction bath and a passive side which is configured to come into contact with at least one electrical conductor. The invention also relates to a method for producing such an electrode.

BACKGROUND

Such electrodes may have an active side with a doped diamond coating. They are known as diamond electrodes and have been known for many years. However, the present invention is not only restricted to diamond electrodes, even though they are advantageous in many applications. Electrodes and particularly diamond electrodes are typically only coated on the active side, which comes into contact with the reaction bath. The passive side, which is preferably opposite the active side, preferably remains uncoated. The electrode is inserted into the reaction bath in such a way that only the coated active side comes into contact with the reaction bath. On the passive side, the electrode is electrically contacted, i.e. brought into contact, by means of at least one electrical conductor. A common method for sealing the reaction bath against the atmosphere or preventing the reaction bath from leaking is to arrange the respective seal on the active side of the electrode. The advantage of this, among other things, is that the full surface of the passive side can be used for the electrical contact. However, it is not necessary to arrange the seal on the active side of the electrode. Additionally or alternatively, it is also possible to use a seal on the passive side of the electrode.

There is also a range of different configurations for the electrical contacting. It usually features a plurality of individual contact points, through each of which only a small proportion of the electrical current is transferred from a current source to the electrode. The individual contacts are preferably designed as pins, particularly preferably spring-loaded in the direction of the electrode, which are advantageously made of a material that exhibits good electrical conductivity, in particular a metal, for example copper. Alternatively or additionally, the contacting may also be designed as a full-surface or partial-surface contact plate, wherein a fleece layer is preferably located between the contact plate and the base body of the electrode. This forms a plurality of individual contacts that transport the electrical current.

During operation of such an electrode, changes in temperature may cause the dimensions of the electrode to change in at least one spatial direction, but generally in multiple spatial directions. It is therefore advantageous if the individual electrical contacts are not firmly and inseparably connected to the electrode. This applies both to contacts designed as individual elements, such as pins, but also for contacts in the form of a fleece or where a fleece is not used. This renders a relative movement between the contacts, i.e. the electrical conductors, and the electrode possible.

Leakages in the seal that seals the reaction bath against the atmosphere may lead to aggressive and corrosive gas phases outside of the actual reaction bath. These pose a particular disadvantage in the region of the passive side, as a corrosion, oxidation or other change in the material of the base body and/or the electrical conductors can impair or completely interrupt the electrical contact in at least some of the contacts. If this is the case, the electrical current that is transferred through the contacts to the electrodes has to flow through fewer contacts. The current density and therefore also the thermal load of the remaining contacts increases and causes further failures. This also applies to electrodes with a base body that has been made from silicon. In addition, the local increase in temperature in the remaining contacts may also cause a local increase in temperature in the base body of the electrode, which may become damaged as a result.

Silicon is preferably used with a specific resistance of less than 20 mOhm*cm. To this end, it may have to be doped.

It is known from the prior art to use metal layers with a high degree of electrical conductivity, such as copper, silver or gold, for the electrical contacting. For example, EP 2 826 576 B1 discloses a silver-based contact material. EP 1 433 867 B1 describes another type of contact material based on silver or tin. These can be firmly attached to the passive side with appropriate bonding agents and surface conditioning of the silicon base body. However, the use of metals is not possible in many applications of the electrodes, for example in semiconductor technology, in order to avoid metallic contamination. In addition, metallic coatings often lead to the formation of an oxidation layer with the associated disadvantages.

SUMMARY

The invention aims to prevent or at least reduce the disadvantages of the prior art.

The invention solves the problem addressed by way of an electrode where the passive side features a doped carbon compound. Although the specific electrical resistance of a carbon layer is some three orders of magnitude greater than that of one of the metals mentioned above, the doped carbon coating makes it possible to apply a layer to the passive side of the base body of the electrode that provides sufficiently good electrical contact on the one hand and a good protective effect against aggressive and/or corrosive gas phases on the other. This also applies in the event of liquid leakage, which results in the electrolyte coming into liquid contact with the passive side of the electrode.

DESCRIPTION OF THE DRAWINGS

FIG. 1 is a schematic view of an exemplary electrode according to the invention.

DETAILED DESCRIPTION

The invention is based on the knowledge that a carbon coating, especially if it is in the form of a doped diamond coating, greatly reduces wear and corrosion on the passive side of the electrode, yet still exhibits sufficient conductivity. In addition, a raw surface of the carbon coating, in particular the diamond coating, can have an activating effect on the individual elements or pins used to transmit the electrical current, since an oxide layer formed on the individual elements or pins is mechanically removed by the relative movement between the electrode and the individual elements or pins.

The doped carbon coating is preferably a doped diamond coating. Doping with boron, for example, increases the electrical conductivity of the diamond coating to such an extent that the electrical current required for operating the electrode can be transferred.

The base body is preferably made from silicon. Alternatively or additionally, the doped carbon coating is doped with boron. The silicon is preferably highly conductive.

In a preferred embodiment, the active side of the electrode features a doped diamond coating, which is preferably doped with boron. FIG. 1 shows a base body 1 of an electrode with an active side 3 and a passive side 5, where the shape of the electrode can be widely varied to suit the needs of the application.

The invention also solves the problem addressed by way of a method for producing an electrode of the type described here, the method comprising the following steps:

a) Coating the active side of the base body with a doped diamond coating, b) Cleaning the passive side, c) Coating the passive side with the doped carbon coating.

In step a) of the method, the active side of the base body is provided with a doped diamond coating. This preferably occurs via vapor deposition, known as CVD (chemical vapor deposition) in the prior art. In this case, it is advantageous if this coating only takes place on the active side of the base body. However, this is difficult to achieve with vapor deposition, such that the passive side of the base body opposite the active side also has a low coating following the execution of step a) of the method. The careful selection of distances between base bodies that are simultaneously coated in a single step of the method reduces the coating of the respective passive side of the base body.

This is why the passive side of the base body is cleaned in step b) of the method. Any deposits or depositions applied to the passive side of the base body in step a) of the method are removed. The passive side that is cleaned in this manner is then coated with a doped carbon coating. This is also preferably done in a CVD process.

The doped carbon coating is only necessary in the area of the passive side, which is used for the electrical contacting. In the case of full-surface contacting, a flat contact element, such as a plate, is arranged on the passive side, preferably pressed against it. In this case, the entire passive side is to be provided with the doped carbon coating. If only partial-surface contacting is used, in which at least one flat contact element is also used, but whose surface is smaller than the passive side of the electrode, only the area of the passive side that comes into contact with the at least one contact element is to be provided with the doped carbon coating. It may be advantageous to use multiple flat contact elements, for example two, three or four. In the case of partial-surface contacting, it may also be advantageous to provide the entire passive side of the electrode with the doped carbon coating.

In the case of contacting via pins or similar elements, it is again only the area of the passive side that comes into contact with the contact elements which must be provided with the doped carbon coating. Coating a larger surface, preferably the entire passive side, is advantageous.

If at least one flat contact element is used, it is advantageous to grind and, where necessary, etch the passive side prior to coating with the doped carbon coating. The passive side can be treated this way even without a flat contact element.

The passive side is preferably ground prior to coating the passive side, wherein it is particularly preferable to remove material of the base body. Coating the active side of the base body leads to a slight bending or deformation of the base body, which also causes the passive side of the base body to deform. In particular, this has an impact on the planarity of the passive side of the base body. Therefore, in step b) of the method, the passive side is not only cleaned but also ground.

A bending of the passive side renders uniform electrical contacting of the passive side more difficult, in particular in the case of full-surface or partial-surface contacting, where a homogeneous current distribution across the different individual contacts is to be achieved. Moreover, grinding the passive side removes any residues that may have formed on the passive side during CVD coating. Particularly preferably, a native silicon surface is available after cleaning the passive side. Grinding the passive side is especially advantageous if extensive, preferably full-surface, contacting of the passive side is to be achieved. If only individual elements or pins are used, the effect of the grinding is smaller, but nevertheless advantageous.

In a preferred embodiment, the base body to be ground, the active side of which already exhibits a doped diamond coating, is placed for grinding on a surface that provides particular protection of the coated active side. To this end, for example, a foil arrangement is used that compensates for any slight unevenness of the coated active side and at the same time prevents mechanical impacts and damages. Preferably a two-part grinding process is used. In a first grinding step, the diamond-coated areas of the passive side are removed. Other parasitically deposited carbon layers, for example graphite or amorphous carbon, are also removed in this process step. As far as possible, there is no infeed into the silicon surface. When the carbon layers have been removed from the passive side, the material of the base body, preferably silicon, is removed in a second grinding step. For example, 10 μm of infeeds are ground with each grinding step. Multiple such grinding steps can be carried out consecutively, wherein it has been proven advantageous if a maximum of five such infeeds are used, so that a maximum of 50 μm of material of the base body is removed.

The passive side is preferably subjected to an etching treatment after grinding, in particular with potassium hydroxide ($KOH_{aq}$) or hydrofluoric acid ($HF_{aq}$). The passive side can be etched with hydrogen or sulphuric acid ($H_2SO_4$) to remove carbon components, especially graphite components. Treatment with sulphuric acid is considerably coarser. When the passive side has been ground, there are normally no more carbon components or graphite components on the passive side. In this case, the passive side can be etched with potassium hydroxide, for example to remove grinding damage from the surface.

In a preferred embodiment, while cleaning the passive side, the passive side is cleaned in at least one gas phase etching step, preferably by means of a hydrogen ($H_2$) gas. The surface of the passive side of the base body is further cleaned by gas phase etching. Adapted diamond nucleation can ensure that as few layer defects as possible occur during the subsequent coating of the passive side with the doped carbon coating.

Preferably, the doped carbon coating is less than 5 μm thick, preferably less than 2 μm thick. It preferably exhibits a thickness of at least 1 μm. The aim is to achieve the thinnest possible layer thickness with a closed, but not necessarily defect-free coating. The lower the thickness of the carbon coating, the smaller the influence of the coating on the base body. By keeping the thickness of the coating as low as possible, a renewed bending of the base body as well as mechanical stresses are reduced. It also lowers costs. The carbon coating is preferably a diamond coating. However, it may also be designed as a graphite layer or a combination of graphite and diamond layers. A fully defect-free carbon layer is advantageous, but not essential. The applied carbon coating is only subjected to a load specifically at the individual electrical contacts.

Preferably, the passive side exhibits a surface roughness of 0.2 μm<$R_a$<0.6 μm prior to coating with the doped carbon coating and/or of $R_z$<10 μm and/or $R_a$<1 μm after coating.

In a preferred embodiment, the doped carbon coating is a doped polycrystalline diamond coating in $sp^3$ configuration. A doped carbon coating in $sp^2$ configuration, which is also possible, exhibits a lower resistance to chemical corrosion as well as poorer mechanical properties. In the neutral basic state, carbon atoms have four electrons in the outermost shell, two of which are in the so-called "s" orbital and two in the so-called "p" orbital. These four orbitals hybridize in the diamond structure to form the so-called "$sp^3$" orbitals.

The invention claimed is:

1. A method for producing an electrode, comprising:
   forming a base body comprising silicon to comprise
      an active side configured to come into contact with a reaction bath, and
      a passive side configured to come into contact with at least one conductor; then
   coating the active side of the base body with a doped diamond coating;
   then
   cleaning a surface of the passive side of the base body by
      grinding the surface of the passive side, and
      etching the surface of the passive side; and then
   coating the surface of the passive side with a doped carbon coating, wherein an electrode is produced with the doped diamond coating on the active side and the doped carbon coating on the passive side, wherein the doped carbon coating has sufficient electrical conductivity to permit current to operate the electrode, wherein the doped carbon coating is 1 μm to 5 μm thick.

2. The method according to claim 1 wherein at least some of the silicon of the base body is ground during the cleaning.

3. The method according to claim 1 wherein the surface of the passive side is subjected to the etching after the grinding.

4. The method according to claim 3 wherein the etching is performed with one or more of potassium hydroxide and hydrofluoric acid.

5. The method according to claim 1 wherein the cleaning of the surface of the passive side comprises at least one gas phase etching step.

6. The method according to claim 5 wherein the at least one gas phase etching step comprises exposure of the surface of the passive side to a hydrogen ($H_2$) gas.

7. The method according to claim 1 wherein the doped carbon coating is less than 2 μm thick.

8. The method according to claim 1 wherein the surface of the passive side exhibits a surface roughness of 0.2 μm<$R_a$<0.6 μm prior to coating with the doped carbon coating and/or of $R_z$<10 μm and/or $R_a$<1.0 μm after coating with the doped carbon coating.

9. The method according to claim 1 wherein the doped carbon coating is a doped polycrystalline diamond coating in $sp^3$ configuration.

10. The method according to claim 1 wherein coating the active side is performed by chemical vapor deposition.

* * * * *